United States Patent
Amin et al.

(10) Patent No.: US 6,627,916 B2
(45) Date of Patent: Sep. 30, 2003

(54) HIGH SENSITIVITY, DIRECTIONAL DC-SQUID MAGNETOMETER

(75) Inventors: Mohammad H. S. Amin, Vancouver (CA); Timothy Duty, Vancouver (CA); Alexander Omelyanchouk, Kharkov (UA); Geordie Rose, Vancouver (CA); Alexandre Zagoskin, Vancouver (CA); Jeremy P. Hilton, Vancouver (CA)

(73) Assignee: D-Wave Systems, Inc., Vancouver (CA)

( * ) Notice: Subject to any disclaimer, the term of this patent is extended or adjusted under 35 U.S.C. 154(b) by 0 days.

(21) Appl. No.: 09/823,895

(22) Filed: Mar. 31, 2001

(65) Prior Publication Data

US 2003/0098455 A1 May 29, 2003

(51) Int. Cl.⁷ .............................................. H01L 39/22
(52) U.S. Cl. .............................. 257/31; 257/34; 257/36; 505/162
(58) Field of Search ...................... 257/31–36; 505/162, 505/190, 193, 702

(56) References Cited

U.S. PATENT DOCUMENTS

| | | |
|---|---|---|
| 5,157,466 A | 10/1992 | Char et al. |
| 5,767,043 A | 6/1998 | Cantor et al. |
| 5,962,866 A | 10/1999 | DiIorio et al. |
| 2003/0038285 A1 * | 2/2003 | Amin et al. ............... 257/31 |

FOREIGN PATENT DOCUMENTS

WO  WO02/069411 A2  9/2002

OTHER PUBLICATIONS

C. Bruder, A. van Otterlo, and G. T. Zimanyi, "Tunnel junctions of Unconventional Superconductors", Physical Review B 51, p. 12904 (1995).

H. Hilgenkamp, J. Mannhart, and B. Mayer, "Implications of dx2–y2 symmetry and faceting for the transport properties of grain boundaries in high–$T_c$ superconductors", Physical Review B 53, pp. 14586–14593 (1996).

E. Il'ichev, V. Zakosarenko, R. P. J. Ijsselsteijn, V. Schultze, H.–G. Meyer, H. E. Hoenig, H. Hilgenkamp, and J. Mannhart, "Nonsinusoidal Current–Phase Relationship of Grain Boundary Josephson junctions in High–Tc Superconductrs", Physical Review Letters 81, pp. 894–897 (1998).

E. Il'ichev, M. Grajcar, R. Hlubina, R.P.J. IJsselsteijn, H.E. Joenig, H.G. Meyer, A. Golubov, M.H.S. Amin, A.M. Zagoskin, A.N. Omelyanchouk, and M. Yu. Kupriyanov, "Degenerate ground state in a mesoscopic $YBa_2Cu_3O_{7-x}$ grain boundary Josephson junction", Los Alamos National Laboratory preprint server cond–mat/0102404 v2, (2001), last accessed Dec. 18, 2002.

(List continued on next page.)

*Primary Examiner*—Sara Crane
(74) *Attorney, Agent, or Firm*—Pennie & Edmonds LLP

(57) ABSTRACT

A solid state dc-SQUID includes a superconducting loop containing a plurality of Josephson junctions, wherein an intrinsic phase shift is accumulated through the loop. In an embodiment of the invention, the current-phase response of the dc-SQUID sits in a linear regime where directional sensitivity to flux through the loop occurs. Changes in the flux passing through the superconducting loop stimulates current which can be quantified, thus providing a means of measuring the magnetic field. Given the linear and directional response regime of the embodied device, an inherent current to phase sensitivity is achieved that would otherwise be unobtainable in common dc-SQUID devices without extrinsic intervention.

24 Claims, 11 Drawing Sheets

OTHER PUBLICATIONS

S. Nicoletti, H. Moriceua, J.C. Villegier, D. Chateigner, B. Bourgeaux, C. Cabanel, and J. Y. Laval, "Bi–epitaxial YBCO grain boundary Josephson junctions on $SrTiO_3$ and sapphire substrates", Physica C 269, pp. 255–267 (1996).

R.R. Schulz, B. Chesca, B. Goetz, C.W. Schneider, A. Schmehi, H. Bielefeldt, H. Hilgenkamp, J. Mannhart, and C.C. Tsuei, "Design and realization of an all d–wave dc–superconducting quantum interference device", Applied Physics Letters 76, pp. 912–914 (2000).

F. Tafuri, F. Carillo, F. Lombardi, F. Miletto Granozio, F. Ricci, U. Scotti di Uccio, A. Barone, G. Testa, E. Sarnelli, J.R. Kirtley, "Feasibility of Biepitaxial YbaCuO Josephson Junctions for Fundamental Studies and Potential Circuit Implementation", Los Alamos National Laboratory preprint server condmat/0010128 (2000), accepted for publication Phys. Rev. B, last accessed Dec. 18, 2002.

Y. Tanaka and S. Kashiwaya, "Theory of Josephson effects in anisotropic superconductor", Physical Review B 56, pp. 892–912 (1997).

C. C. Tsuei and J. R. Kirtley, "Pairing symmetry in cuprate superconductors", Reviews of Modern Physics 72, Issue 4, pp. 969–1016 (2000).

D. J. Van Harlingen, "Phase–sensitive tests of the symmetry of the pairing state in the high–temperature superconductors—Evidence for $d_{x^2-y^2}$ symmetry", Reviews of Modern Physics 67, 515–535 (1995).

D. Koelle, R. Kleiner, F. Ludwig, E. Dantsker and John Clarke, "High–transition–temperature superconducting quantum interference devices", Reviews of Modern Physics 71, pp. 631–686 (1999).

H. Hilgenkamp, "Josephson devices with intrinsic $\pi$–phase shifts" abstract from "Structure and Arrangement of Vortices in Superconductors", Conference Prague Czech Republic, 3–7, Apr. 2002.

\* cited by examiner

HIGH SENSITIVITY, DIRECTIONAL DC-SQUID MAGNETOMETER

BACKGROUND

1. Field of the Invention

This invention relates to dc-SQUID magnetometry and superconducting electronics and, in particular, to a magnetometer including a superconducting SQUID having an inherent phase shift without application of external magnetic fields.

2. Discussion of Related Art

Very precise measurements of small magnetic fields can be accomplished with a dc-SQUID magnetometer device. A conventional dc-SQUID magnetometer includes a superconducting loop containing a plurality of Josephson junctions, coupled to terminals. Any change in the magnetic field which penetrates the superconducting loop disturbs the current through the device, which is detectable at the terminals. Thus, the dc-SQUID can be used as a device for measuring changes in a magnetic field.

Conventional dc-SQUID magnetometers lack inherent sensitivity. Furthermore, a conventional dc-SQUID magnetometer can only determine the magnitude of the change in a magnetic field, but cannot distinguish the direction of the change. In order to hyper-sensitize a standard dc-SQUID, flux-biasing can be used to shift the latent flux position in the SQUID loop into a linear response regime. A standard dc-SQUID loop behaves in accordance with a well defined current-phase relationship. The equilibrium position of the current-phase relation of a standard dc-SQUID lies in a region of sensitivity where the induced superconducting current is proportional to a small perturbation in the flux squared ($I \propto \Phi^2$), and resultingly there is no directional sensitivity. By biasing the SQUID loop with an applied flux, the equilibrium position can be shifted into a more sensitive linear response regime, thus introducing directional sensitivity into the current response as well. This can be accomplished by introducing a phase shift of the equilibrium position in the current-phase relation. The phase shift is realized in conventional dc-SQUID devices by application of an external magnetic field to the dc-SQUID device, a technique called flux biasing. In other words, with an externally applied magnetic flux on the SQUID device, a small perturbation in the flux induced by the magnetic field that is being measured will result in a linear response in the superconducting current from the SQUID device.

Furthermore, by coupling multiple SQUID loops, it is possible to enhance the sensitivity of the dc-SQUID magnetometer. See U.S. Pat. No. 5,767,043, entitled "Multiple Squid Direct Signal Injection Device Formed On a Single Layer Substrate," to Cantor et al., herein incorporated by reference in its entirety. One application of dc-SQUID magnetometry is as a non-destructive testing device in the field of semi-conductor electronics. In the electronics industry, each circuit that is manufactured must be non-destructively tested for correct operating parameters. This is accomplished by running current through the circuit to be tested and measuring the resulting magnetic fields. However, in order to detect flaws in the magnetic field a high degree of resolution is required, which cannot be achieved without flux biasing or coupling the dc-SQUIDs that make up the magnetometer. Thus, there is a necessity for increasing the latent sensitivity of the SQUID magnetometer.

Further applications for dc-SQUID magnetometers range in practical uses. For example, dc-SQUID magnetometers are used in Magnetic Resonance Imaging, microscopic metal defect detection, mine detection, and submarine detection. Additional examples of uses for dc-SQUID magnetometers include analogue-to-digital converters and optical switches. Given the broad range of applications of dc-SQUID Magnetometers, there is a need for devices with increased sensitivity, including directional sensitivity, wherein the overall size and cost of a device is reduced.

There are, however, practical limitations to current methods of dc-SQUID sensitizing. Biasing the loop introduces magnetic fields that may interfere with the fields or system being measured. Similarly, coupling dc-SQUIDs can lead to bulky measurement tools that increase the obtainable distance from the sample, thereby also decreasing the ability to measure magnetic fields in the sample.

The use of a phase shifter in order to sensitize the current-phase behavior in a superconducting loop is known; however, the inherent sensitization has been restricted to a $\pi$-phase shift. Thus there is a need for a device that can be used in dc-SQUID magnetometry with a high level of latent sensitivity, as well as directional sensitivity without the application of external magnetic fields.

SUMMARY

In accordance with the present invention, a dc-SQUID magnetometer is presented which provides an inherent phase shift in a superconducting loop, i.e. a phase shift in the absence of an external magnetic field. Some embodiments of a dc-SQUID magnetometer according to the present invention include a high sensitivity, directional, superconducting Josephson device formed of a superconductive loop having a $\pi/2$-Josephson junction and a 0-Josephson junction. The superconductive loop is further coupled to at least two terminals by which a current may flow through the loop.

The superconducting materials forming the superconducting loop and terminals can have dominant order pairing symmetry with non-zero angular momentum. In some embodiments, the superconducting material can be a high temperature, d-wave superconductor such as $YBa_2Cu_3O_{7-x}$, where x has values less than 0.4 and greater than 0.05, or $Bi_2Sr_2Ca_{n-1}Cu_nO_{2n+4}$. In some other embodiments, a dc-SQUID magnetometer according to the present invention can include a p-wave superconducting material forming 0-junctions and $\pi/2$-junctions. An example of a p-wave superconducting material includes $Sr_2RuO_4$.

Junctions having a $\pi/2$ phase shift or a 0 phase shift, for example, can be fabricated at the grain boundary of two d-wave superconducting materials. For example, in a junction formed at the grain boundary between two d-wave superconducting materials with a 45° misalignment in their crystal lattice structures, a $\pi/2$ phase shift results in a junction that is perpendicular to the terminals of the junction. Similarly, a 0° phase shift can be achieved in a grain boundary Josephson junction in which the misalignment in the crystal orientation between the superconductors on either side of the grain boundary is zero (in the trivial case) or, the 0° phase shift can be achieved in the case of a symmetric 22.5° grain boundary junction, where the a-axis of the order parameter of the two superconductors are rotated ±22.5° from parallel to the junction interface, respectively.

The combination of a 0-junction and a $\pi/2$ junction induces an overall $\pi/2$-phase shift in the current as the superconducting loop is traversed, thus shifting the equilibrium position of the current-phase relation Resultingly, a $\pi/2$ dc-SQUID loop according to the present invention has a linear current-phase response with small changes in externally applied magnetic flux. The measured current is also sensitive to the direction of the flux through the loop. Further, the π/2 dc-SQUID loop does not require any externally applied flux biasing. This inherent phase shift allows for an order of 100 fold increase over the sensitivity of standard embodiments of dc-SQUID loops without the use of external means. Additionally, no external circuitry is required to bias the SQUID loop.

An embodiment of a SQUID magnetometer according to the present invention can be fabricated by bi-epitaxial methods, although other deposition methods can also be utilized. For example, in the fabrication of a d-wave superconducting SQUID magnetometer according to the present invention, a seed layer may be deposited on a substrate and a first buffer layer may be deposited on the seed layer. In some embodiments, the seed layer may be MgO, the substrate $SrTiO_3$ or Sapphire, and the first buffer layer $CeO_2$. The first buffer layer and the seed layer may be etched, for example by Xe-ion milling although any appropriate etching method can be used, to form a boundary. The boundary separates a first area having the seed layer and the first buffer layer from a second area where the seed layer and the first buffer layer have been removed. A second buffer layer can be deposited on the second area and the first buffer layer. A superconducting material may then be deposited on the second buffer layer and etched, for example by Xe-ion milling although any appropriate etching method can be used, to form a loop and terminals. Resultingly, Josephson junctions are formed along the boundary. The boundary can be shaped so that both a 0-junction and a π/2 junction are achieved at the boundary. The second buffer layer may also be of $CeO_2$.

The first buffer layer and the second buffer layer are deposited so that there is a lattice mismatch between the superconducting material deposited over the first area where the seed layer has been deposited and the superconducting material deposited over the second area, resulting in a grain boundary in the superconducting material at the boundary.

A magnetometer according to the present invention may exhibit inherent phase shifts of any value. Phase shifts other than a π/2 phase shift can also result in a magnetometer operating in a linear region. These and other embodiments are further discussed below with respect to the following figures.

In the figures, elements with the same designation have similar or identical functions.

DETAILED DESCRIPTION

Figure 1:
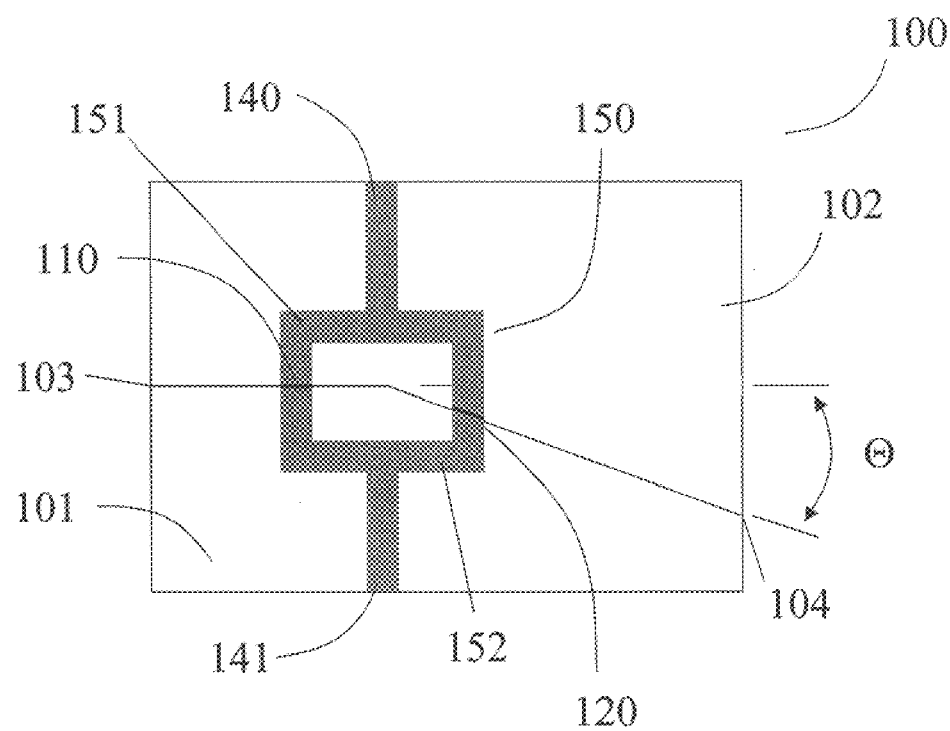
FIG. 1 shows a plan view of an embodiment of a SQUID Magnetometer according to the present invention.

FIG. 1 shows a plan view of an embodiment of a SQUID magnetometer 100 according to the present invention. SQUID magnetometer 100 of FIG. 1 includes loop 150, junctions 110 and 120, and terminals 140 and 141. Loop 150 and terminals 140 and 141 can be formed of a d-wave superconducting material or a p-wave superconducting material deposited on areas 101 and 102. Portion 151 of loop 150 is formed in area 102 and portion 152 of loop 150 is formed in area 101.

Loop 150 and junctions 110 and 120 provide an intrinsic phase shift to the current in magnetometer 100. Intrinsic phase shifters are described in M. H. S. Amin, T. Duty, A. Omelyanchouk, G. Rose and A. Zagoskin, U.S. Provisional Application Serial No. 60/257624, "Intrinsic Phase Shifter as an Element of a Superconducting Phase Quantum Bit", filed Dec. 22, 2000, and the references therein, which is herein incorporated by reference in its entirety. A phase shifting structure with 0 and π-phase shifts in a two-terminal DC SQUID is described in R. R. Schulz, B. Chesca, B. Goetz, C. W. Schneider, A. Schmehl, H. Bielefeldt, H. Hilgenkamp, J. Mannhart and C. C. Tsuei, "Design and realization of an all d-wave dc pi-superconducting quantum interference device", Appl. Phys. Lett. 76, 7 p.912 (2000), and the references therein, which is incorporated herein by reference in its entirety.

Areas 101 and 102 indicate the surface of two misaligned crystal lattice structures. In some embodiments, the crystal lattice structure of the surface of area 101 is rotated about 45° with respect to the crystal lattice structure of the surface of area 102. The areas 101 and 102 form grain boundaries 103 and 104 at their intersection. As a result of this misalignment, when the superconductor materials of terminals 140 and 141 and of SQUID loop 150 are deposited, the crystal orientation is determined by that of the material of areas 101 and 102 respectively. In other words, terminal 140 and portion 151 of loop 150 have a crystal lattice structure determined by the material of area 102 whereas terminal 141 and portion 152 of loop 150 have a crystal lattice structure determined by the material of area 101. Examples of superconducting materials which may be included in a d-wave superconducting Josephson device 100 are $Yba_2Cu_3O_{7-x}$ and $Bi_2Sr_2Ca_{n-1}Cu_nO_{2n+4}$, which both have d-wave order pairing symmetry. An example of a p-wave superconducting material which can be utilized to form device 100 includes $Sr_2RuO_4$. To achieve the π/2-phase shift in the p-wave superconductor case, the grain boundary rotation angle should be about 45°, and the order parameter should change to having a vertical alignment on one side of the grain boundary, and a horizontal alignment on the other side of the grain boundary. Any superconducting material with a dominant order pairing symmetry having a non-zero angular momentum can be used to form device 100.

Josephson junctions 110 and 120 are formed at grain boundaries 103 and 104, respectively. In the embodiment shown in FIG. 1, grain boundary 103 (and hence junction 110) is formed parallel with a horizontal axis of the magnetometer. A vertical axis can be defined in device 100 along the directions of terminals 140 and 141 as shown in FIG. 1. Grain boundary 104, however, is angled with respect to grain boundary 103 by an angle of Θ, such that the resulting junction on the SQUID loop is a zero or pi-phase shift Josephson junction, which in some embodiments can be a symmetric 22.5° Josephson junction.

The current passing through junction 110 behaves according to the relationship $I=I_c \sin 2(\theta-\theta')$, where $\theta$ is the phase of the superconducting region 151, and $\theta'$ is the phase in the superconducting region 152. Furthermore, the current passing through junction 120 behaves according to the relationship $I=I_c \sin(\Psi-\Psi')$, where again, $\Psi$ represents the phase of the superconductor in region 151, and $\Psi'$ presents the phase of the superconductor in region 152. The total current through the terminals 140 and 141 is just the sum of the currents through the junctions, which is dependent upon the embodiment of the invention. Specifically, variation in the width of the junctions or branches, the width of the overall loop, and the roughness of the junctions are the key factors involved in calculating the ratio of current in each branch of the loop. In an exemplary embodiment, the ratio is $I_1=2I_2=I_c$. Thus, the total current is given by $I=I_c (\sin \phi_2+\phi_e)-\frac{1}{2} \sin 2\phi_2)$, where $\phi_2=\theta-\theta'$, and $\phi_e=\phi_{1-\phi 2}$, and the dependence of $\phi_2$ on $\phi_e$ can be easily calculated by taking the derivative of I with respect to $\phi_2$ and finding the maximums and minimums. Furthermore, it is possible to derive from this the critical current—flux relationship (see FIG. 5c). In some embodiments, the angle of symmetry, $\Theta$, can be about $\pi/8$ radians, such that junction 120 is a symmetric 22.5°-phase shift Josephson junction.

Figure 2:
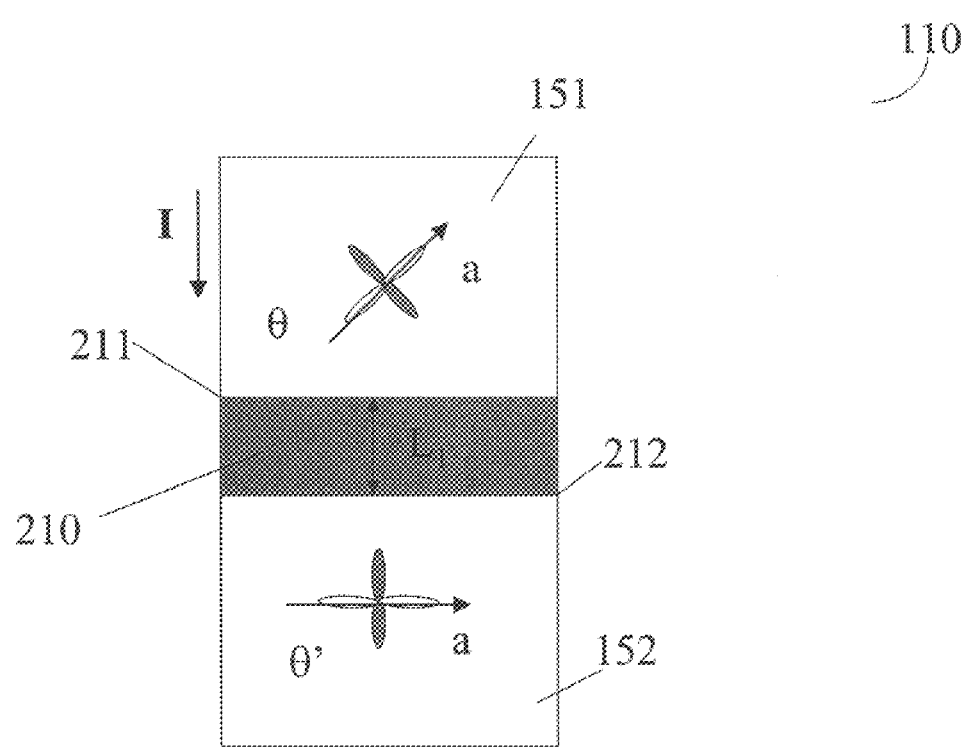
FIG. 2 shows a plan view of an embodiment of a π/2 Josephson junction.

FIG. 2 shows an example of a $\pi/2$-phase shift grain boundary Josephson junction 110. Junction 110 is formed at grain boundary 103 (FIG. 1) by portion 152 and portion 151 separated by a junction boundary 210. Boundary 210 can be a small gap between the two superconductors, or it can include an insulating material. As described above, portion 152 and portion 151 are each formed of a superconducting material having a dominant order pairing symmetry with non-zero angular moment. A lattice mismatch between the two superconducting materials in regions 151 and 152 introduces a phase shift in the quantum order parameter y as the junction is traversed. In some embodiments, the a-crystallographic direction of the superconducting material of portion 151 is rotated by $\pi/4$ from the a-crystallographic direction of the superconducting material of portion 151. The order parameter of the superconducting material is directly related to the crystallographic orientation. Therefore, the phase shift of current that has traversed the grain boundary of FIG. 2, is $\theta-\phi$, where $\theta$ represents the phase of the supercurrent before crossing the grain boundary junction, and $\phi$ represents the phase incurred by the supercurrent in crossing the grain boundry junction. In FIG. 2, 4 is $\pi/2$, and the overall phase shift of the junction 210 is $\pi/2$.

The embodiment of junction 110 shown in FIG. 2 is an asymmetric junction. In that case, the a-crystallographic axis of portion 152 is rotated from boundary 212 by about 0° and the a crystallographic axis of portion 151 is rotated from boundary 211 by about 45°, yielding a total mismatch between the a-crystallographic axis between the superconducting materials of portions 151 and 152 of 45° ($\pi/4$). The a-crystallographic axis of the superconducting materials of portions 151 and 152 is indicated by arrows in FIG. 2. Additionally, the phase $\theta$, and $\theta'$ of the of the supercurrent is shown in each of portion 151 and 152.

Figure 3:
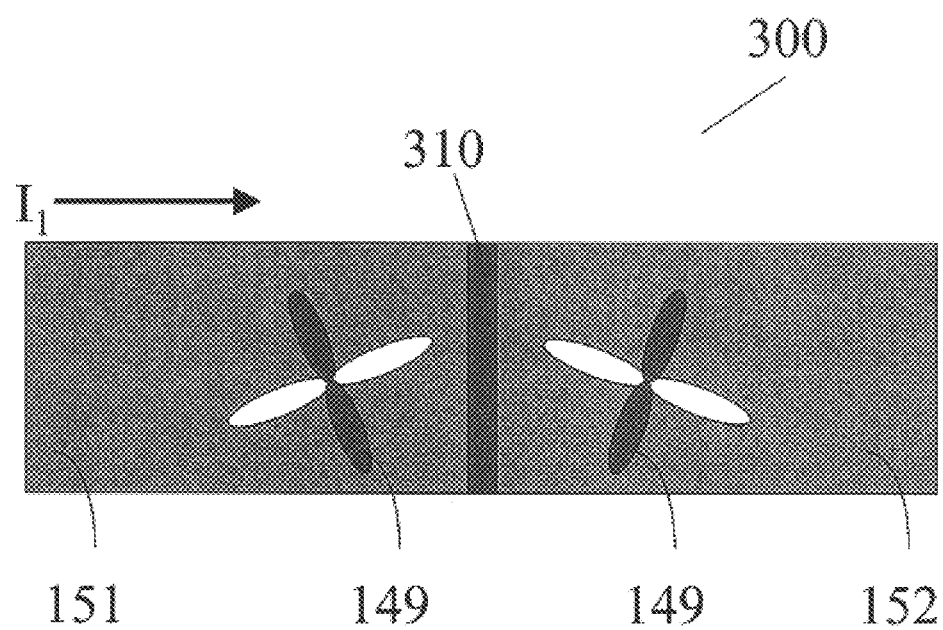
FIG. 3 shows a plan view of a symmetric 22.5° Josephson junction.

A 0 phase shift grain boundary Josephson junction, embodied here as a symmetric 22.5° grain boundary Josephson junction, 300 is illustrated in FIG. 3. Junction 300 is symmetric because order parameter 149 in portion 152 is a mirror image of order parameter 149 in portion 151. The supercurrent $I_1$ crossing grain boundary 310 from one direction has a dominant path that is the same regardless of the direction from which junction 300 is approached. Thus, the total phase incurred across grain boundary 310 is 0. Symmetric 22.5° Josephson junctions are further discussed in E. Il'ichev, M. Grajcar, R. Hlubina, R. P. J. Ijsselsteijn, H. E. Hoenig, H. G. Meyer, A. Golubov, M. H. S. Amin, A.M. Zagoskin, A. N. Omelyanchouk, and M. Yu. Kupriyanov, "Degenerate ground state in a mesoscopic $YBa_2Cu_3O_{7-x}$ grain boundary Josephson junction", LANL, cond-mat/0102404 v2, Feb. 23, 2001, and the references therein, which is herein included by reference in its entirety.

Figure 4:
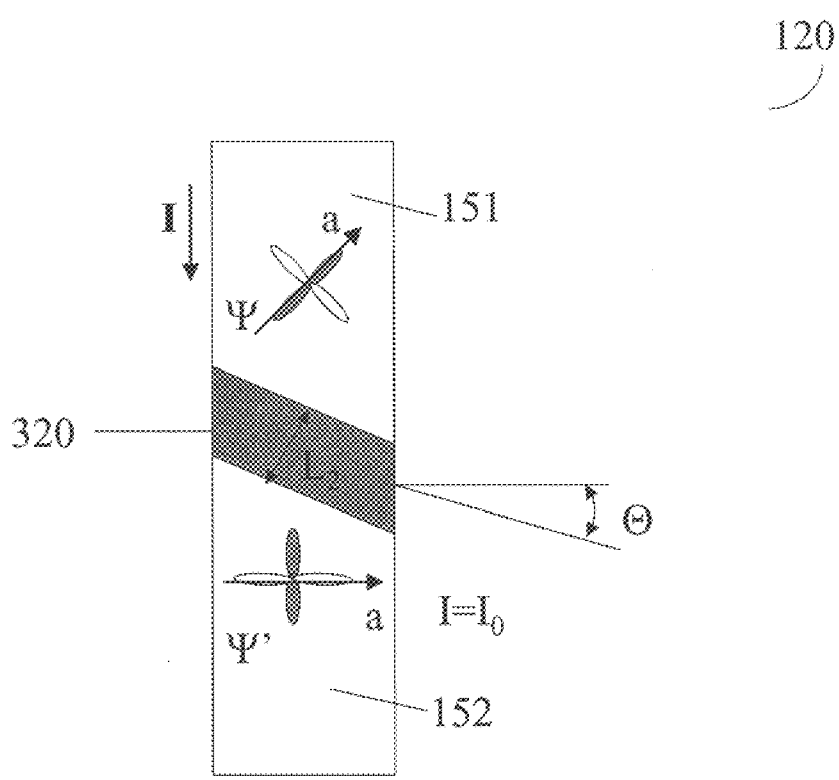
FIG. 4 shows a plan view of an embodiment of a 0 Josephson junction.

FIG. 4 shows an example of a 0-junction 120. Again, the lattice mismatch between the a-crystallographic directions of the superconducting materials of portions 151 and 152 is the same as the lattice mismatch indicated in the discussion of FIG. 2 above. The a-crystallographic directions and the superconducting order parameter $\psi$ and $\Psi'$ are shown in FIG. 4 for each of the superconducting materials of portions 151 and 152, which shows a $\pi/2$ phase shift in the order parameter $\psi'$ with respect to the order parameter orientation of $\Psi$. Portions 151 and 152 are separated by junction boundary 320. Injunction 120 of FIG. 4, however, boundary 320 is not perpendicular to the direction of the superconducting current I. Instead, boundary 320 follows the grain boundary 104 and therefore is angled from the perpendicular direction by the angle of symmetry $\Theta$. The angle of symmetry $\Theta$ can vary, but in an exemplary embodiment of the invention, $\Theta=22.5°$, and the resulting junction is a symmetric 22.5° grain boundary Josephson junction, which, as shown in FIG. 3, results in a 0 phase shift in the supercurrent I across junction 120.

The widths of the junctions, 110 and 120, $L_1$ and $L_2$, respectively, are chosen to maximize the device sensitivity to flux threading in loop 150 by controlling the amount of supercurrent that travels along each branch of dc-SQUID 100. In some embodiments where junction 110 is a $\pi/2$ junction and junction 120 is a 0-junction, then widths $L_1$ and $L_2$ can be on the order of 1 $\mu m$. One skilled in the art will recognize that SQUID magnetometer 100 according to the present invention can have any combination of junctions 110 and 120 such that total intrinsic phase shift of loop 150 is realized. Sensitization of the dc-SQUID is realized for a range of phase shifts, where the phase shift can vary from $0<\phi<\pi$. Phase shifts of around $\pi/2$, as described above, further lead to directional sensitivity. Therefore, there is a hardy tolerance in the fabrication of the invention in terms of junction behavior, as well as allowing for a plurality of Josephson junctions that total a phase shift within the desired range.

Figure 5A:
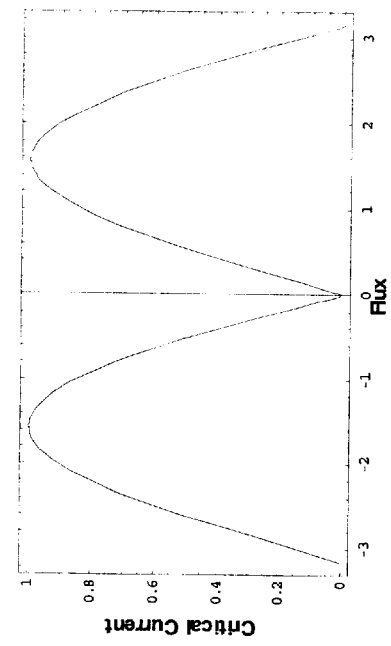
FIGS. 5a, 5b, and 5c shows critical current—flux relations for a standard 0-phase shift dc-SQUID, a π-phase shift dc-SQUID, and a π/2-phase shift dc-SQUID, respectively.
Figure 5B:
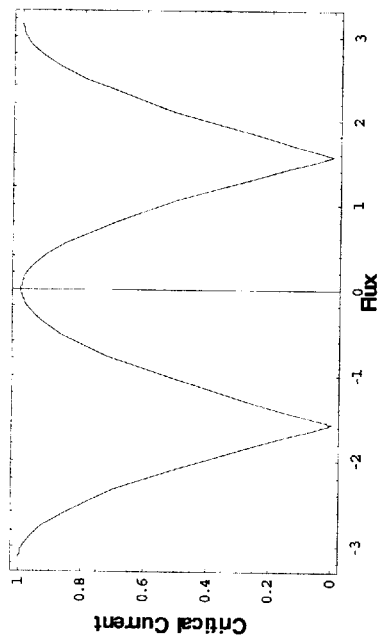
Figure 5C:
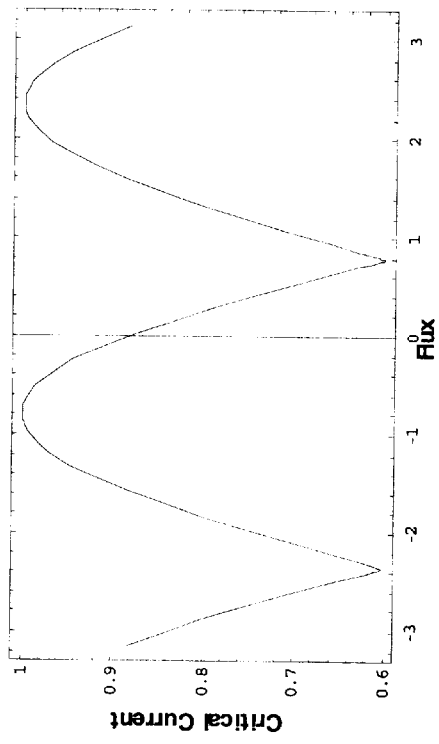

FIGS. 5a through 5c illustrate a comparison of the Critical Current-Flux relation for a 0-phase shift SQUID magnetometer, a $\pi$-phase shift SQUID magnetometer and a $\pi/2$-phase shift SQUID magnetometer according to the present invention. FIGS. 5a through 5c show that the critical current in the superconducting loop can be directly correlated with the flux through the loop. Characterization of the relationship can be found experimentally by controlling the supercurrent through dc-SQUID magnetometer 100 and measuring the flux in the loop with an instrument such as a magnetometer, or, in a contrary fashion, by applying a magnetic field through SQUID loop 100 and measuring the resulting supercurrent. In another experimental procedure, a constant current is applied across the terminals and the potential drop across the SQUID loop is measured.

FIG. 5a shows the current-phase relationship for a 0 phase-shift SQUID loop. At 0 current and a normalized phase shift of 1, the response curve is at a peak. Therefore, a change in the flux through the loop results in a decrease in the supercurrent, that is independent of the direction of the flux in the loop. The response of a $\pi$ dc-SQUID as shown in FIG. 5b is a useful variation of the response shown in FIG. 5a of the dc-SQUID as the sensitivity of the π dc-SQUID is linear with overall phase. As is clear from FIG. 5b, a change in the flux in the loop results in a steep change in the current, but again, the change is positive in both cases and thus is independent of the direction of the flux in the loop. The response of a π/2 dc-SQUID is shown in FIG. 5c. In the π/2 dc-SQUID, the equilibrium position (at 0 current) is also at a point where the sensitivity is linear with phase. However, a small perturbation in the flux through the loop causes a positive change in the current for one direction, and a negative change in the current for the other direction, thus allowing for directional sensitivity. An advantage of embodiments of a dc-SQUID magnetometer 100 in accordance with the present invention is a 2 fold increase in sensitivity over a conventional π dc-SQUID due to the sensitivity to direction of flux through the loop.

Figure 6A:
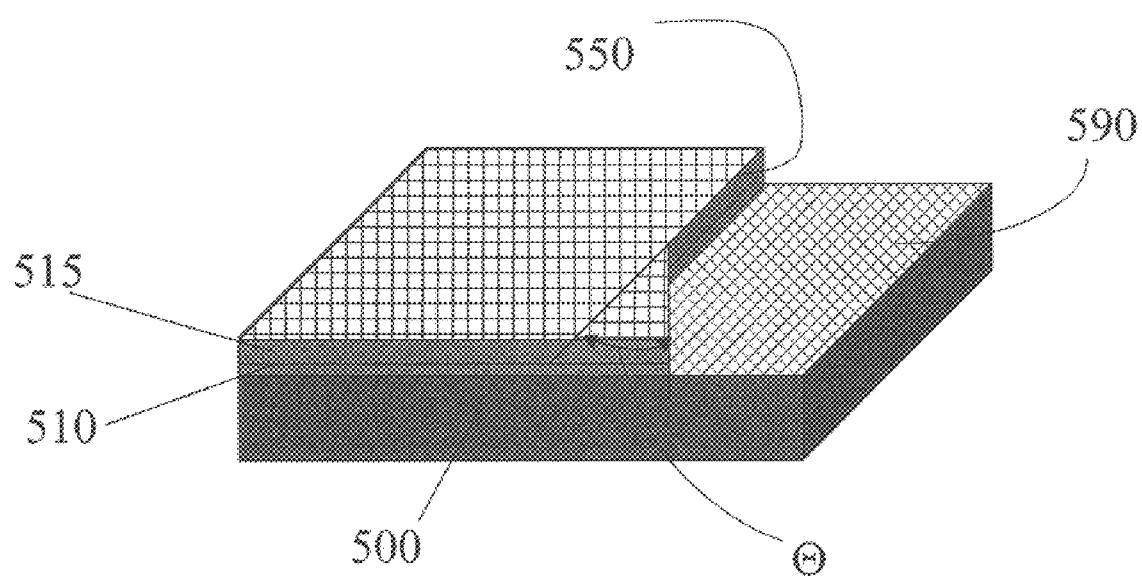
FIGS. 6a through 6c illustrate an example bi-epitaxial fabrication method.
Figure 6B:
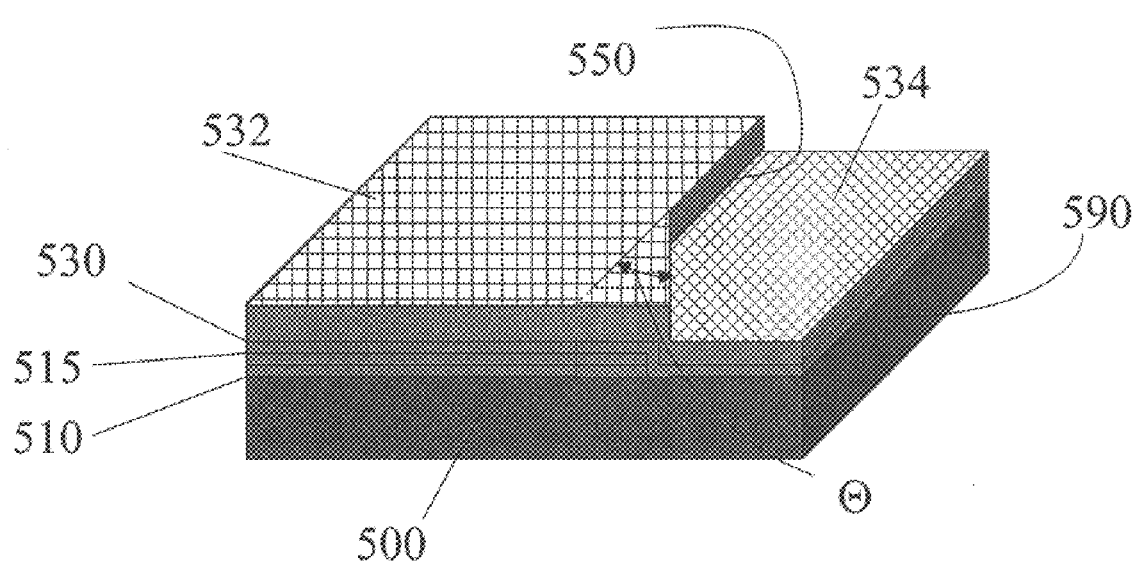
Figure 6C:
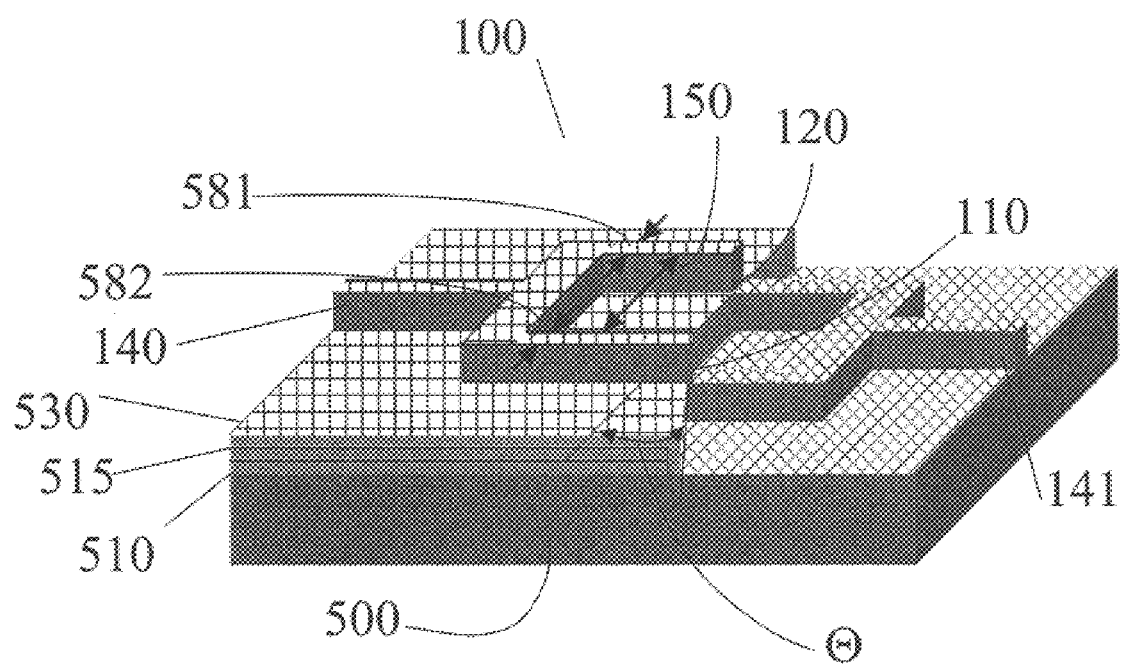

FIGS. 6a through 6c illustrate an example of fabrication of a SQUID magnetometer according to the present invention. In this example, a bi-epitaxial fabrication method is employed, although one skilled in the art will recognize that other deposition methods can also be employed. Exemplary methods of biepitaxial fabrication are described in S. Nicoletti, H. Moriceau, J. C. Villegier, D. Chateigner, B. Bourgeaux, C. Cabanel, and J. Y. Laval, "Bi-epitaxial YBCO grain boundary Josephson junctions on SrTiO$_3$ and sapphire substrates," Physica C, 269, p.255–267, 1996, and the references therein, which is hereby included by reference in its entirety. Further discussions regarding fabrication of a grain boundary between two d-wave semiconductor materials is further discussed in F. Tafuri, F. Carillo, F. Lombardi, F. Miletto Granozio, F. Ricci, U. Scotti di Uccio, A. Barone, G. Testa, E. Samelli, J. R. Kirtley, "Feasibility of Biepitaxial YBaCuO Josephson Junctions for Fundamental Studies and Potential Circuit Implementation, Los Alamos preprint server cond-mat/0010128, accepted for publication Phy. Rev. B (2000), which is herein incorporated by reference in its entirety. The behavior of such junctions on the phase shift of the order parameter is discussed in C. Bruder, A. van Otterlo, and G. T. Zimanyi, "Tunnel junctions of Unconventional Superconductors," PRB 51, 12904 (1995); and C. C. Tsuei, "Design and realization of an all d-wave dc π-superconducting quantum interference device," Applied Physics Letters, 76, p.912 (2000), each of which is included herein by reference in its entirety.

In some embodiments, a seed layer followed by a buffer layer is deposited onto a substrate such as SrTiO$_3$ or Sapphire by means of pulsed laser deposition. The buffer layer forms on the substrate with a rotated crystallographic orientation (π/2 in some embodiments). Different crystallographic orientations can be achieved through the use of different buffer materials. A section of the seed and buffer layer can then be removed by a process such as Xe ion milling. The milling creates the weak link boundary (i.e., boundaries 103 and 104 of FIG. 1) for the device. Next, a second buffer layer followed by the high-T$_c$ superconducting film are deposited, and the final structure is realized through further etching of the film. The buffer layers can be formed of CeO$_2$ for example.

FIG. 6a shows an intermediate structure having a substrate layer 500 as a base for the bi-epitaxial fabrication process. Substrate layer 500 can be, for example, a layer of SrTiO$_3$ or Sapphire. A seed layer 510 is formed on substrate layer 500. Seed layer 510, for example, can be of MgO. In some embodiments, seed layer 510 can be about 5 nm thick. A buffer layer 515 can then be deposited on seed layer 510. In some embodiments, buffer layer 515 can be of CeO$_2$ and can have a thickness of approximately 11 nm. Seed layer 510 and buffer layer 515 can then be milled away (for example by Xe-ion milling) from section 590, as illustrated in FIG. 5A, such that a boundary 550 is formed. Angle Θ illustrates a bend in boundary 550, corresponding to the bend between boundary 103 and boundary 104 of FIG. 1. In some embodiments, the angle Θ can be chosen as 22.5°. Boundary 550, with a bend angle Θ, can be fabricated with smooth and sharp features using any of a number of etching techniques such as Xe ion milling.

In some embodiments, boundary 550, with bend angle Θ, is oriented with respect to the crystal structure of buffer layer 515 such that, once a d-wave crystal structure is deposited on top of buffer layer 515, the d-wave crystal structure is oriented with it's a-axis at a 22.5° angle with respect to boundary 550 in one portion and at 0° in a second portion where the portions are separated by the bend at bend angle Θ. Reversly, boundary 550 can be arranged such that the a-axis of the superconducting crystal structure is oriented at 45° with respect to boundary 550 in one portion and 22.5° with respect to boundary 550 in a second portion.

FIG. 6b shows deposition of a second buffer layer 530 on top of section 590. Buffer layer 530 can have a thickness of approximately 18 nm and, again, can be of CeO$_2$. The crystal orientation of buffer layer 515 differs from the crystal orientation of buffer layer 530 such that the intersection of layers 530 and 515 at boundary 550 creates a grain boundary.

A superconducting layer 532 can then be deposited on buffer layer 515 and a superconducting layer 534 can be deposited on buffer layer 530 in such a way that boundary 550 remains clean and sharp. Superconducting layers 532 and 534 can be about 200 nm in thickness. The crystal orientations of the superconducting materials of layers 532 and 534 are determined by the crystal orientation of underlying seed layer 510 or substrate 500, respectively. In some embodiments, a 45° lattice mismatch is arranged between the superconducting material of layer 532 and the superconducting material of layer 534. In some embodiments the high-T$_c$ superconducting material of layers 532 and 534 is a material such as YBa$_2$Cu$_3$O$_{7-x}$, where x is some value greater than 0 and less than 0.6.

FIG. 6c shows SQUID magnetometer 100 completely fabricated. As illustrated in FIG. 6c, superconducting layers 532 and 534 are etched into dc-SQUID 100 using, for example, a process such as Xe ion milling, with the resulting junctions 110 and 120 being a π/2-junction and 0-junction, respectively. The width of each of junctions 110 and 120 helps define the operation parameters of the SQUID by effecting the capacitance and critical current values. For example, having the width of junction 110 as twice that of junction 120 doubles the current in the 110 branch and halves the current in the 120 branch. In an exemplary embodiment, the width of branches 581 and 582, in superconducting loop 150, are on the order of 1 micrometer, which is much smaller than the width if the overall SQUID loop 150. Furthermore, by tuning the widths of branches 581 and 582, dc-SQUID 100 can be made substantially impervious with respect to the degree of cleanliness of junctions 110 and 120. In one particular embodiment formed with superconducting material YBa$_2$Cu$_3$O$_{7-x}$, where x has values less than 0.6 and greater than 0.05, the widths of junctions 110 and 120 ($L_1$ and $L_2$, respectively) are both about 1 μm respectively, the width of branches 581 and 582 are also approximately 1 μtm as well, and the inside separation between branches 581 and 582 is approximately 10 μm.

Figure 7:
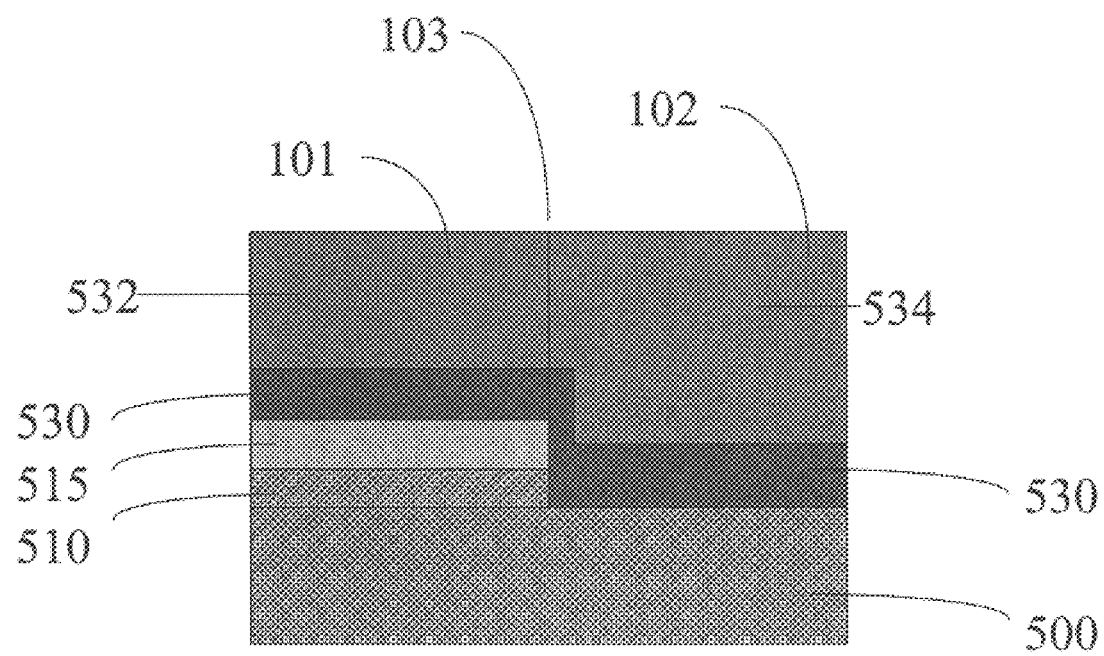
FIG. 7 shows a cross sectional view of an exemplary bi-epitaxial fabrication method.

FIG. 7 shows a cross-sectional view of an example of a junction fabricated as described above with FIGS. 6a through 6c. Each of the contributing layers are shown approximately to scale before any Ion milling. Substrate 500 can be SrTiO$_3$, and can be approximately 50 nm in thickness. Seed layer 510 can be of MgO, and can be approximately 5 nm thick. Seed layer 510 has been milled away from the right hand side of the sample (under section 102) shown in FIG. 7. Buffer layer 515 can be of CeO$_2$ and can be approximately 11 nm thick. First buffer layer has also been milled away from the side under section 102. Second buffer layer 530 can be of the same material as the first buffer layer, but with a thickness of approximately 18 nm. Further, second buffer layer 530 can be deposited over first buffer layer 515. Finally, the supercodonductive material 532 and 534 is deposited onto the sample with a thickness of approximately 200 nm. The thickness values and materials given in this example are exemplary, and in no way limit the scope of the fabrication of the invention.

Figure 8:
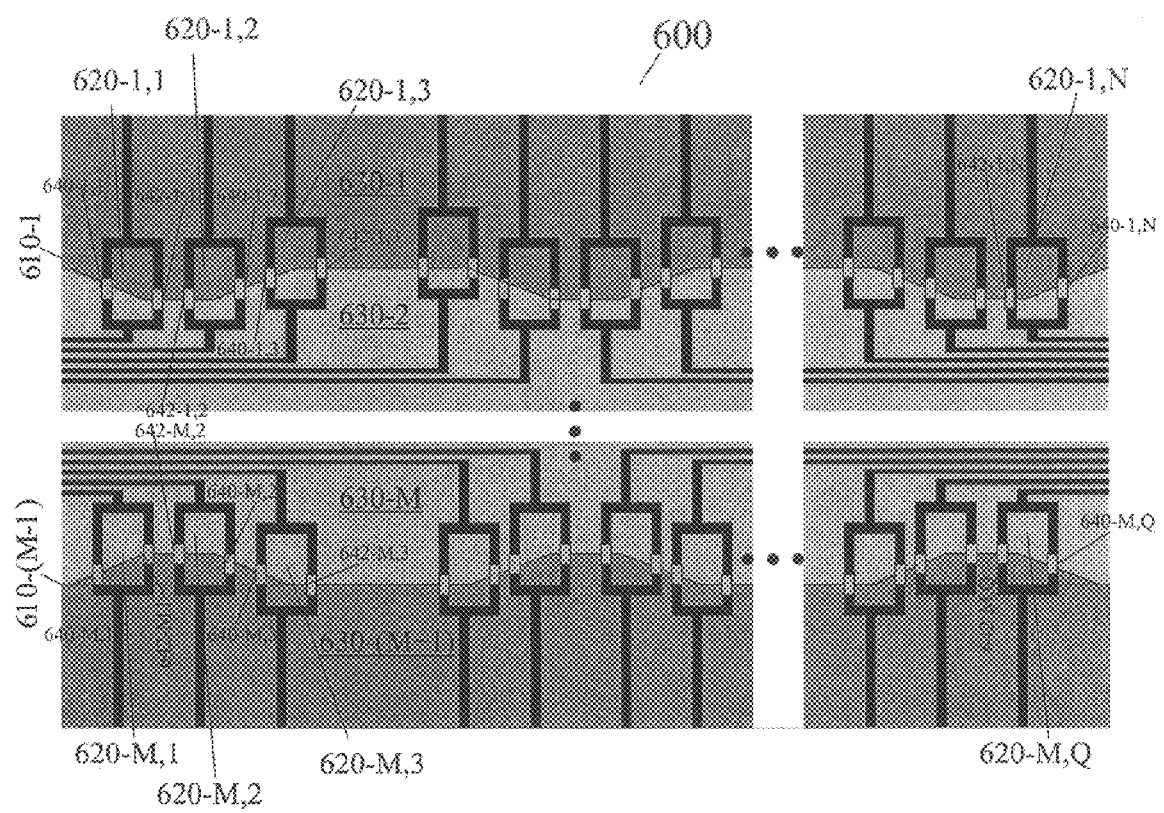
FIG. 8 shows a plan view of a 2-dimensional array of SQUID magnetometers according to the present invention.

FIG. 8 illustrates an embodiment of a 2-dimensional array 600 of dc-SQUID magnetometers according to the present invention. Array 600 includes SQUID magnetometers 620-1,1 through 620-M,Q as shown in FIG. 6. In the embodiment of FIG. 8, each row can include a different number of magnetometers. Each of SQUID magnetometers 620-1,1 through 620-1,N is formed along a grain boundary 630-1 between regions 630-1 and 630-2. Grain boundary 610-1 is shaped to provide positions for the formation of both 0-junctions and π/2-junctions and conversely π-junctions and π/2 junctions. Each of grain boundaries 610-1 through 610-M is shaped to provide for the fabrication of at least one 0-junction or π-junction and at least one π/2-junction for each SQUID magnetometer 620-1,1 through 620-M,Q formed along that grain boundary.

Array 600 includes regions 610, 612 and 614. In regions 610 and 614, d-wave superconducting material can be deposited with a first crystallographic orientation and in region 612 d-wave superconducting material can be deposited with a second crystallographic orientation such that the lattice mismatch at the grain boundaries allows for creation of 0-junctions and π/2 junctions along the grain boundaries between regions 610 and 612 and between regions 612 and 614. Furthermore, the shape of the grain boundary between regions 610 and 612 and regions 612 and 614 can be set in order to facilitate the production of a 0-junction and a π/2 junction in each SQUID magnetometer. SQUID magnetometers 620-1,1 through 620-M,Q include 0-junctions 640-1,1 through 640-M,Q, respectively, and π/2 junctions 642-1,1 through 642-M,Q, respectively, as shown in FIG. 6. SQUID magnetometers 620-1,1 through 620-M,Q of array 600 can be fabricated as described above with respect to FIGS. 6a through 6c. One skilled in the art will recognize that array 600 can be extended to an array including a plurality of dimensions and a plurality of π/2 dc-SQUID magnetometers. For example, a series of array 600 can be coupled to create a multi-dimensional array. In some embodiments, a series of array 600 magnetometers is stacked to form a three dimensional magnetometer.

Figure 9:
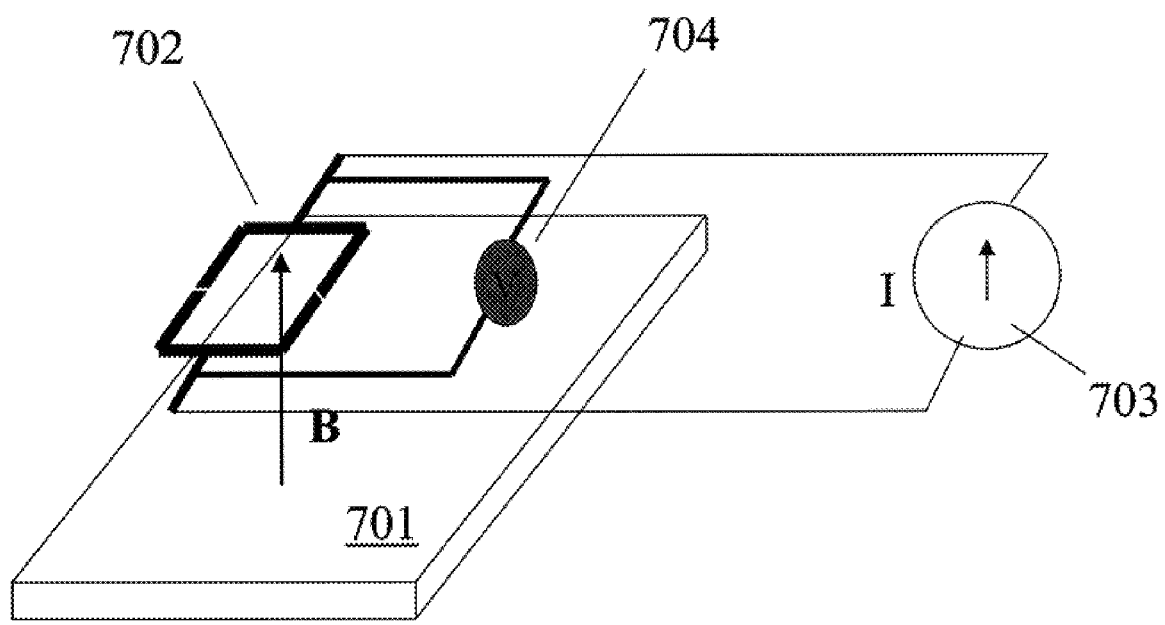
FIG. 9 shows a dc SQUID magnetometer according to the present invention utilized to measure a magnetic field.

FIG. 9 illustrates the utilization of a π/2 SQUID magnetometer 702 according to the present invention. Magnetometer 702 can include a single SQUID loop or may be an array of SQUID loops such as array 600 illustrated in FIG. 8. Magnetometer 702 is positioned in proximity to a magnetic field source 701.

In some applications, source 701 can be a quantum qubit. In some other applications, source 701 can be an electronic circuit. In some further applications, source 701 can be a superconducting circuit. Source 701 can also be a magnetic resonance imaging system, a metallic sample being tested for defects, a mine, or a submarine. In general, source 701 can be any source of a magnetic field.

Magnetometer 701 is coupled to a current device 703 in series and a voltmeter 704 in parallel. Current device 703 applies a constant current to the dc-SQUID Magnetometer. Any magnetic fields can be detected by the voltmeter. Embodiments of current device 703 are well known in the art. In an exemplary embodiment, the voltmeter 704 can be a radio-frequency single electron transistor. In operation, presence of an external magnetic field induces a superconducting current in magnetometer 701 which exceeds the critical current of the superconducting loop. Resultingly, a the junctions in the loop become resistive, and the voltmeter 704 registers a voltage. Since magnetometer 701 is direction sensitive, voltmeter 704 is capable of determining both the strength of the magnetic field $\vec{B}$, and any variation in the magnetic field $\vec{B}$, and the direction of the magnetic field $\vec{B}$.

The above described embodiments are exemplary only and are not intended to be limiting. One skilled in the art will recognize variations from the particular embodiments described above that are intended to be within the spirit and scope of this invention. As such, the invention is limited only by the following claims.

What is claimed is:

1. A Josephson device, comprising:
   a superconducting loop;
   a plurality of Josephson junctions in the superconducting loop; and
   wherein a superconducting current in the SQUID loop experiences an accumulated intrinsic phase shift over the path of the SQUID loop.

2. The device of claim 1, wherein the plurality of Josephson junctions includes two junctions.

3. The device of claim 2, wherein the plurality of Josephson junctions are formed along a grain boundary, the grain boundary having a bend from a straight path at a point inside the superconducting loop.

4. The device of claim 3, wherein the two junctions includes a α junction and a π/2 junction.

5. The device of claim 4, wherein the π/2 junction is an asymmetric junction.

6. The device of claim 4, wherein the α junction is a symmetric junction.

7. The device of claim 6, wherein the symmetric junction is a symmetric, 22.5° grain boundary Josephson junction.

8. The device of claim 3, wherein the superconducting material at the grain boundary has a lattice mismatch.

9. The device of claim 8, wherein the lattice mismatch is about 45°.

10. The device of claim 2, wherein the bend is approximately 22.5° from a straight path.

11. The device of claim 1, wherein the superconducting material is a high temperature superconductor.

12. The device of claim 11, wherein the high temperature superconducting material is YBa$_2$Cu$_3$O$_{7-x}$, where x is some value greater than or equal to 0 and less than about 0.6.

13. The device of claim 1, wherein the superconducting material is a p-wave superconductor.

14. The device of claim 13, wherein the superconducting material is Sr$_2$RuO$_4$.

15. The device of claim 4, wherein branches of the superconducting loop are on the order of 1 micrometer in width.

16. The device of claim 15, wherein the width of the loop is much longer than the width of the junctions.

17. The device of claim 15, wherein the widths of each branch in the loop are not the same.

18. A method of measuring a magnetic field, comprising:

provided a SQUID magnetometer having an intrinsic phase shift;

positioning the SQUID magnetometer in proximity with a magnetic source; and monitoring changes in the current through the SQUID magnetometer in order to monitor magnetic changes in the magnetic source.

19. The method of claim 18, wherein the magnetic source is a flux qubit.

20. The method of claim 18, wherein the magnetic source is an electronic circuit.

21. The method of claim 20, wherein the electronic circuit is semi-conducting.

22. The method of claim 20, wherein the electronic circuit is superconducting.

23. A magnetometer array, comprising:

a plurality of superconducting loops having an intrinsic phase shift, each superconducting loop of the plurality of superconducting loops including a superconducting material with a plurality of Josephson junctions in the loop.

24. The device of claim 23, wherein a plurality of arrays are coupled to create a multi-dimensional magnetometer array.

* * * * *

UNITED STATES PATENT AND TRADEMARK OFFICE
CERTIFICATE OF CORRECTION

PATENT NO.    : 6,627,916 B2
DATED         : September 30, 2003
INVENTOR(S)   : Amin et al.

It is certified that error appears in the above-identified patent and that said Letters Patent is hereby corrected as shown below:

<u>Column 10,</u>
Line 38, cancel beginning with "4. The device of claim 3" to and including "junction." and insert the following claim:
    4. The device of claim 3, wherein the two junctions includes a 0 junction and a $\pi/2$ junction.
Line 42, cancel beginning with "6. The device of claim 4" to and including "junction." and insert the following claim:
    6. The device of claim 4, wherein the 0 junction is a symmetric junction.

Signed and Sealed this

Twenty-seventh Day of July, 2004

JON W. DUDAS
*Acting Director of the United States Patent and Trademark Office*